United States Patent
Ogawa et al.

(10) Patent No.: US 10,050,133 B2
(45) Date of Patent: Aug. 14, 2018

(54) APPLICATION OF THIN INSULATING FILM LAYER IN SEMICONDUCTOR DEVICE AND METHOD OF MANUFACTURING SEMICONDUCTOR DEVICE

(71) Applicant: FUJI ELECTRIC CO., LTD., Kanagawa (JP)

(72) Inventors: Eri Ogawa, Matsumoto (JP); Takashi Yoshimura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/170,945

(22) Filed: Jun. 2, 2016

(65) Prior Publication Data

US 2016/0300936 A1  Oct. 13, 2016

Related U.S. Application Data

(63) Continuation of application No. PCT/JP2015/067468, filed on Jun. 17, 2015.

(30) Foreign Application Priority Data

Jun. 18, 2014 (JP) .................. 2014-125007
Feb. 24, 2015 (JP) .................. 2015-033862

(51) Int. Cl.
*H01L 29/739* (2006.01)
*H01L 29/868* (2006.01)
(Continued)

(52) U.S. Cl.
CPC .... *H01L 29/7391* (2013.01); *H01L 21/02225* (2013.01); *H01L 21/02255* (2013.01);
(Continued)

(58) Field of Classification Search
CPC ......... H01L 21/02225; H01L 21/02282; H01L 21/2636; H01L 21/28158; H01L 29/0619;
(Continued)

(56) References Cited

U.S. PATENT DOCUMENTS

| 2007/0049051 A1* | 3/2007 | Ahn ..................... C23C 16/40 |
| | | 438/778 |
| 2009/0230393 A1* | 9/2009 | Miyoshi ................ H01L 29/861 |
| | | 257/49 |

(Continued)

FOREIGN PATENT DOCUMENTS

| CN | 101533859 A | 9/2009 |
| JP | S51144575 A | 12/1976 |

(Continued)

OTHER PUBLICATIONS

International Search Report for International Patent Application No. PCT/JP20151067468, issued by the Japan Patent Office dated Aug. 11, 2015.

(Continued)

*Primary Examiner* — Shahed Ahmed

(57) ABSTRACT

In a pin diode, a new means for a soft recovery other than the means for the soft recovery using an anode layer with a low concentration and a local lifetime control is provided. A semiconductor device comprising a drift layer of a first conductivity type provided on a semiconductor substrate of a first conductivity type, a front-surface-side region of a second conductivity type provided on a front surface side of the drift layer, an insulating-film layer provided on a front surface side of the front-surface-side region with a thickness thinner than a natural oxide film, and a metal layer provided on a front surface side of the insulating-film layer is provided.

12 Claims, 11 Drawing Sheets

(51) Int. Cl.

| | | |
|---|---|---|
| *H01L 21/02* | (2006.01) | |
| *H01L 21/263* | (2006.01) | |
| *H01L 21/28* | (2006.01) | |
| *H01L 29/06* | (2006.01) | |
| *H01L 29/32* | (2006.01) | |
| *H01L 29/40* | (2006.01) | |
| *H01L 29/51* | (2006.01) | |
| *H01L 29/66* | (2006.01) | |
| *H01L 29/861* | (2006.01) | |

(52) U.S. Cl.
CPC .... *H01L 21/02282* (2013.01); *H01L 21/2636* (2013.01); *H01L 21/28158* (2013.01); *H01L 29/0619* (2013.01); *H01L 29/32* (2013.01); *H01L 29/404* (2013.01); *H01L 29/517* (2013.01); *H01L 29/66128* (2013.01); *H01L 29/7395* (2013.01); *H01L 29/7397* (2013.01); *H01L 29/868* (2013.01); *H01L 29/8611* (2013.01)

(58) Field of Classification Search
CPC ..... H01L 29/32; H01L 29/404; H01L 29/517; H01L 29/66128; H01L 29/7391; H01L 29/7395; H01L 29/7397; H01L 29/8611; H01L 29/868
USPC .................. 257/104, 109, 656; 438/237, 328
See application file for complete search history.

(56) References Cited

U.S. PATENT DOCUMENTS

| | | | | |
|---|---|---|---|---|
| 2011/0284839 | A1* | 11/2011 | Yamazaki | ......... H01L 21/02554 257/43 |
| 2012/0261676 | A1* | 10/2012 | Nakano | ................. H01L 29/165 257/77 |
| 2012/0299164 | A1* | 11/2012 | Nishimura | .......... H01L 29/0619 257/656 |

FOREIGN PATENT DOCUMENTS

| | | |
|---|---|---|
| JP | S54-65483 A | 5/1979 |
| JP | S6046038 A | 3/1985 |
| JP | S62160730 A | 7/1987 |
| JP | H1-262672 A | 10/1989 |
| JP | H07-226521 A | 8/1995 |
| JP | H11-162874 A | 6/1999 |
| JP | 2000-332243 A | 11/2000 |
| JP | 2003-224281 A | 8/2003 |
| JP | 2010-41000 A | 2/2010 |

OTHER PUBLICATIONS

"A growing process of a natural oxide film." URL: http://www.heureka.co.jp/Japanese/Datas/QR120K/GrowthofNativeOxide.html (accessed Mar. 7, 2016).

Hitoshi Tsunoda "Evaluation of the microroughness of a silicon wafer surface" Applied Physics, vol. 66, No. 12 (1997).

M. Gotoh, "Roughening of the Si/SiO2 interface during SC1-chemical treatment studied by scanning tunneling microscopy" J. Vac. Sci. Technol. B18(4), Jul./Aug. 2000.

Takeshi Ohwaki et. al, "Characterization of Silicon Native Oxide Formed in SC-1 H2O2 and Wet Ozone Processes," Japanese journal of applied physics. Pt. 1, Regular papers & short notes 36(9A), 5507-5513, Sep. 15, 1997.

Takeo Hattori, "Silicon Native Oxide," Surface technology, vol. 45, No. 1, 1994.

International Preliminary Report on Patentability for International Application No. PCT/JP2015/067468, issued by the International Bureau of WIPO dated Dec. 29, 2016.

Office Action issued for counterpart Chinese Application 201580002936.0, issued by the Chinese Intellectual Property Office dated May 10, 2018.

Office Action issued for counterpart Japanese Application 2016-529402, issued by the Japanese Patent Office dated May 22, 2018.

* cited by examiner

APPLICATION OF THIN INSULATING FILM LAYER IN SEMICONDUCTOR DEVICE AND METHOD OF MANUFACTURING SEMICONDUCTOR DEVICE

The contents of the following Japanese patent applications are incorporated herein by reference:
NO. 2014-125007 filed in JP on Jun. 18, 2014
NO. 2015-033862 filed in JP on Feb. 24, 2015
NO. PCT/JP2015/067468 filed on Jun. 17, 2015.

BACKGROUND

1. Technical Field

The present invention relates to a power semiconductor device such as a semiconductor rectifier element (hereinafter referred to as a diode) and IGBT (Insulated Gate Bipolar Transistor).

2. Related Art

In recent years, various power converters including inverters are utilized in the field of power electronics. An inverter has a freewheeling diode (FWD) for power connected in anti-parallel with a switching element such as IGBT. For making the frequency of the inverter higher, the performance improvement of the FWD along with the performance improvement of the switching element is important.

FIG. 11 is a cross-sectional view showing the structure of a conventional typical freewheeling diode for power. The power diode is a diode comprising a p-intrinsic-n-type (pin-type) structure and it maintains a high voltage in a highly resistive intrinsic layer (i layer). This i layer is also referred to as an $n^-$ drift layer 62. The power diode having a rated voltage of 600V or more uses a wafer which is cut out from an ingot of silicon, etc., so an n-type semiconductor substrate (wafer) constitutes an $n^-$-drift layer 62. A p-anode layer 63 is formed on one surface side of the $n^-$ drift layer 62. An anode electrode 65 which passes a main current is connected on surface 64 of this p-anode layer 63. The p-anode layer 63 and the anode electrode 65 pass the main current, so they are referred to as active regions. On the one hand, a $p^+$-guard ring 71 and a field plate electrode 72 connecting to the $p^+$ guard ring 71 are formed so as to surround this p-anode layer 63. Additionally, in an outer circumference end of a chip of the diode, a p-type or n-type channel stopper layer 73 and a stopper electrode 74 connecting to the channel stopper layer 73 are formed. As above, the portion surrounding the outer circumference of the active region is the region for relaxing an electric field when a reverse bias voltage is applied on the diode and is referred to as an edge termination region. An interlayer insulating film 68 is formed in a portion of the surface of the diode. The interlayer insulating film 68 protects the semiconductor surface such that the semiconductor surface is not exposed. Although not further depicted in the figures, a protective film for protecting the surface such as a polyimide film or a silicon oxide film is also formed. On another surface of the $n^-$-drift layer 62, n-field stop layer 67 with a higher concentration than that of the $n^-$-drift layer 62 is formed. This n-field stop layer 67 comprises a function for inhibiting the spreading of the depletion region. Additionally, an $n^+$-cathode 61 is formed to make contact also with the n-field stop layer 67 on another surface of the semiconductor substrate. A cathode electrode 66 is formed such that it connects with the $n^+$-cathode 61.

As the performance improvement of FWD, a soft recovery due to a reduction in a reverse recovery peak current (Irp), which is a peak value of a reverse recovery current (Irr), is included in addition to a loss reduction due to reductions in a forward voltage (Vf) and a reverse recovery charge (Qrr). The reverse recovery peak current (Irp) can be reduced by lowering an injection efficiency of the anode. FIG. 3, etc. of Patent Document 1 shows a diode comprising a structure referred to as MPS (Merged Pin Schottky). The diode suppresses the injection of holes from the anode and achieves the soft recovery while suppressing an increase of leak current by establishing a Schottky junction and pn junction jointly. In the diode of pin structure, a similar effect can be obtained also by simply lowering the concentration of the p-type anode layer. For example, the technique for forming a defect layer having many lattice defects in the outermost surface of the p-type anode layer and reducing the injection efficiency in a diode with the pin structure is described in FIG. 1, etc. of Patent Document 2.

Also, the injection efficiency of the anode can be lowered to achieve the soft recovery as well by decreasing selectively the lifetime of the anode side of the n-type drift layer by putting the light ions such as helium and proton on the surface side.

Additionally, in FIG. 1, etc. of Patent Document 3, a diode of the pin structure with a natural oxide film placed between a p-type polysilicon layer (corresponding to the p-type anode layer) and an $n^-$-type semiconductor layer (corresponding to the drift layer) is described.

However, if a concentration of the anode layer is extremely lowered in the pin diode, there is a risk that the p-layer becomes depleted when a high voltage is applied and punches through the anode electrode and the leak current increases. Also, even if designing the pin diode not to cause the above punch-through does not occur, the tolerance for external disturbances such as a defect in a process and a microcrack at the time of assembling decreases.

Also, if a local lifetime control was performed by the irradiation of light ions, there is similarly a risk in which the leak current increases, and there exits an issue which leads to an increase in the cost of elements, because irradiation facilities are very expensive.

Additionally, in case of the diode described in Patent Document 3, the strongest electric field is generated in a natural oxide film between the p-type polysilicon layer and the $n^-$-type semiconductor layer as a reverse bias voltage is applied, so the possibility that the natural oxide film results in breakdown becomes high. (Prior art documents)

PATENT DOCUMENTS

Patent Document 1: Japanese Patent Application Publication No. 07-226521
Patent Document 2: Japanese Patent Application Publication No. 2003-224281
Patent Document 3: Japanese Patent Application Publication No. 2009-218496

There are cases for semiconductor devices when usage of a natural oxide film is not desirable. For example, for a pin diode, there is an issue of the above breakdown if the natural oxide film is used. In the pin diode, it is desired that the soft recovery is done such that the aforementioned risk will not occur as much as possible.

SUMMARY

In a first embodiment of the present invention, a semiconductor device comprising a drift layer of a first conductivity type provided on a semiconductor substrate of the first conductivity type, a surface-side region of a second conductivity type provided on a surface side of the drift layer, a thin insulating-film layer with a thickness thinner than the natural oxide film, provided on a surface side of the surface-side region, and a metal layer provided on a surface side of the insulating-film layer is provided.

It may further comprise a plurality of guard ring layers of a second conductivity type selectively formed on the front surface side of the drift layer so as to surround the front-surface-side region and formed by spacing apart from the front-surface-side region, and the insulating-film layer may be provided on front surface side of the plurality of guard ring layers. The front-surface-side region may be an anode layer.

The front-surface-side region may be a contact region of the second conductivity type between the multiple gate electrodes. It may further comprise an insulating-film layer between an outer electrode provided in at least a portion of the vicinity of the outer circumference of the semiconductor device and a metal electrode connecting electrically to the plurality of gate electrodes. The thickness of the insulating-film layer may be greater than or equal to 1 Angstrom and less than or equal to 6 Angstrom.

The insulating-film layer may not include more Si—H bonds than the natural oxide film at an interface of the semiconductor substrate and the insulating-film layer. The insulating-film layer does not need to contain nitrogen.

In a second embodiment of the present invention, a method of manufacturing a semiconductor device comprising a surface-structure forming step of selectively forming a front-surface-side region, a thermal oxide film, and an interlayer insulating film respectively on a front surface side of a semiconductor substrate of a first conductivity type, and an insulating-film-layer forming step of forming an insulating-film layer which is thinner than a natural oxide film on the surface of the semiconductor substrate that is exposed in an opening portion of the interlayer insulating film selectively formed is provided.

The insulating-film layer forming step may include exposing the exposed surface of the semiconductor substrate to a mixed solution of ammonium water, hydrogen peroxide water, and pure water. According to a concentration of ammonium water in the mixed solution, thickness of the insulating-film layer may be adjusted. The concentration of the ammonium water in the mixed solution may be more than or equal to 1 ppm and less than or equal to 150000 ppm.

DESCRIPTION OF EXEMPLARY EMBODIMENTS

By referring to the accompanying drawings below, preferred embodiments of the semiconductor device and the method of manufacturing the semiconductor device according to the present invention are described. In the present specification and the accompanying drawings, it is meant that the electrons or holes are majority carriers in the layers or regions specified with n or p, respectively. Also, '+' and '−' attached on 'n' and 'p' respectively mean that the higher impurity concentration and the lower impurity concentration than the layer or region to which it is not attached. In the description of the embodiments and accompanying drawings below, the same labels are attached on similar structures, and overlapping descriptions are omitted. The 'concentration' described below indicates a concentration of a dopant indicating n-type or p-type conductivity, in other words, the doping concentration, if not specifically explained. In the present specification, it is described that the first conductivity type is n-type and the second conductivity type is p-type. However, it may be reversed to make the first conductivity type p-type and the second conductivity type n-type.

Although the present invention is described through the embodiments of the invention below, the embodiments below do not limit the invention according to the scope of claims. Also, not all of the combinations of the characteristics described in the embodiments are necessary for the means for solving the problem of the invention.

Embodiment 1

Figure 1:
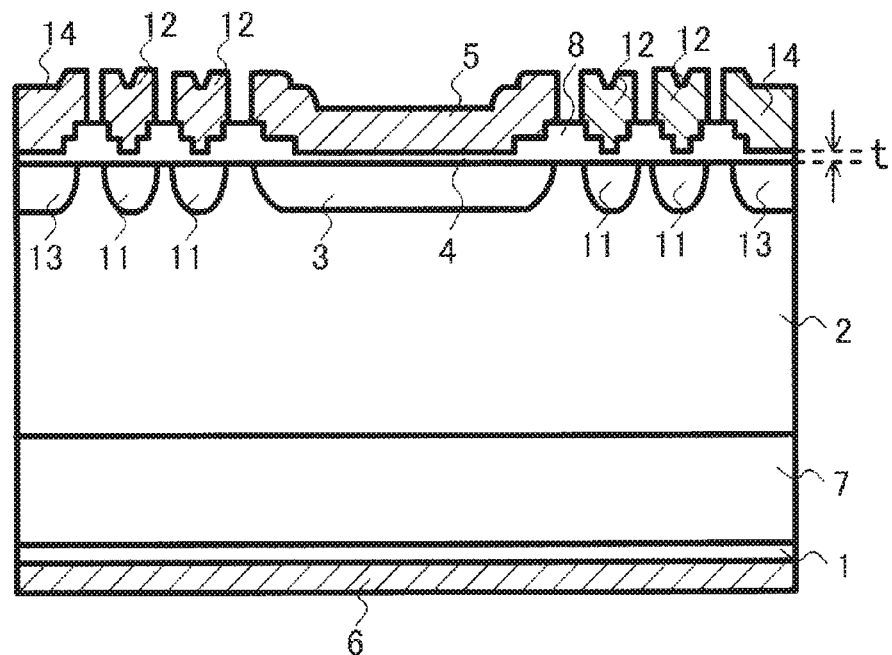
FIG. 1 is a cross-sectional view showing the layer structure of the semiconductor device according to Embodiment 1.

FIG. 1 is a cross-sectional view showing the cross-sectional structure of the semiconductor device according to Embodiment 1 of the present invention. The semiconductor device is made a pin diode in the present Embodiment 1. The silicon semiconductor substrate uses a cut wafer from a silicon ingot formed by, for example, CZ (Czochralski method), MCZ (Magnetic field applied Czochralski method), FZ (Float zone method), etc. The specific resistance of the wafer is, for example, higher than 10 Ωcm, for example, 55-90 Ωcm. The thickness of the $n^-$-drift layer 2 may be, for example, 100-130 μm.

The semiconductor device comprises the $n^-$ drift layer 2 as a drift layer of a first conductivity type, an oxide film layer 4 as an insulating-film layer, and an anode electrode 5 as a metal layer. The $n^-$-drift layer 2 is provided in the silicon semiconductor substrate of the first conductivity type. On the front surface side of the $n^-$-drift layer 2, a p-anode layer 3 as a front-surface-side region of a second conductivity type with an impurity concentration higher than that of the $n^-$-drift layer 2 is provided.

On a front surface side of the p-anode layer 3, an extremely thin oxide film layer 4 with the thickness of several angstroms is provided. The thickness of the oxide film layer 4 is thinner than the natural oxide film. The oxide film layer 4 covers the entire p-anode layer 3.

The anode electrode 5 is provided on the front surface side of the p-anode layer 3 with this oxide film layer 4 placed in between. The anode electrode 5 is spaced apart from the p-anode layer 3 by the oxide film layer 4. The thickness t of the oxide film layer 4 to be this spacing distance determines the electrical characteristic of the diode.

It is a characteristic that the thickness t of the oxide film layer 4 is thinner than the thickness of the natural oxide film (20 angstroms or more). By forming this oxide film layer 4 between the p-anode layer 3 and the anode electrode 5, the injection of carriers (holes) is suppressed more than in the conventional structure. Also, when a reverse bias voltage is applied on the diode, the depletion layer spreads inside the p-anode layer 3 and n⁻-drift layer 2, so no voltage is allotted to the oxide film layer 4. Accordingly, a strong electric field is not generated in the oxide film layer 4. Therefore, breakdown of the oxide film layer 4 does not occur. The thickness t of the oxide film layer 4 is described hereinafter.

The dopant of the p-anode layer 3 is boron, for example. The total impurity concentration of boron may be $1 \times 10^{13}$ $cm^{-2}$-$5 \times 10^{13}$ $cm^{-2}$, and the depth of diffusion may be approximately 4 µm or less.

The anode electrode 5 and the p-anode layer 3 are to be active regions which pass the main current. The semiconductor device of the present example comprises a plurality of p⁺-guard ring layers 11 as a plurality of guard ring layers of the second conductivity type formed selectively on the front surface side of the n⁻-drift layer 2 so as to surround the active region and formed by spacing apart from the p-anode layer 3.

A p⁺-guard ring layer 11 and a field plate electrode 12 are provided so as to surround the active region. Also, channel stopper layers 13 and stopper electrodes 14 are provided so as to surround the p⁺ guard ring layers 11 and the field plate electrodes 12. The region surrounding this active region is the edge termination region.

The oxide film layer 4 is provided also on the front surface side of the plurality of p⁺-guard ring layers 11. The p⁺-guard ring layers 11 and the field plate electrodes 12 are spaced apart with the oxide film layer 4 placed in between, similar to the active region. The channel stopper layer 13 and the stopper electrode 14 are similarly spaced apart with the oxide film layer 4 placed in between. An interlayer insulating film 8 is provided on the front surface side of the semiconductor substrate, between the anode electrode 5 and the field plate electrodes 12, between the field plate electrodes 12 themselves, and between the field plate electrodes 12 and the stopper electrodes 14.

An n⁺ cathode layer 1 is provided on the back surface side of the silicon semiconductor substrate. The cathode electrode 6 is provided on the back surface side of the n⁺ cathode layer 1. The n⁺ cathode layer 1 and the cathode electrode 6 are connected with each other.

In the present example, an n-field stop layer 7 is provided between the n⁺-cathode layer 1and the n⁻-drift layer 2. For the n⁺ cathode layer 1, the total impurity amount of phosphorous to be the dopant may be $1 \times 10^{15}$ $cm^{-2}$–$1 \times 10^{16}$ $cm^{-2}$. Also, the thickness of the n⁺ cathode layer 1 may be 1 µm or less. Next, the manufacturing method for the semiconductor device of the present invention is described.

Figure 2:
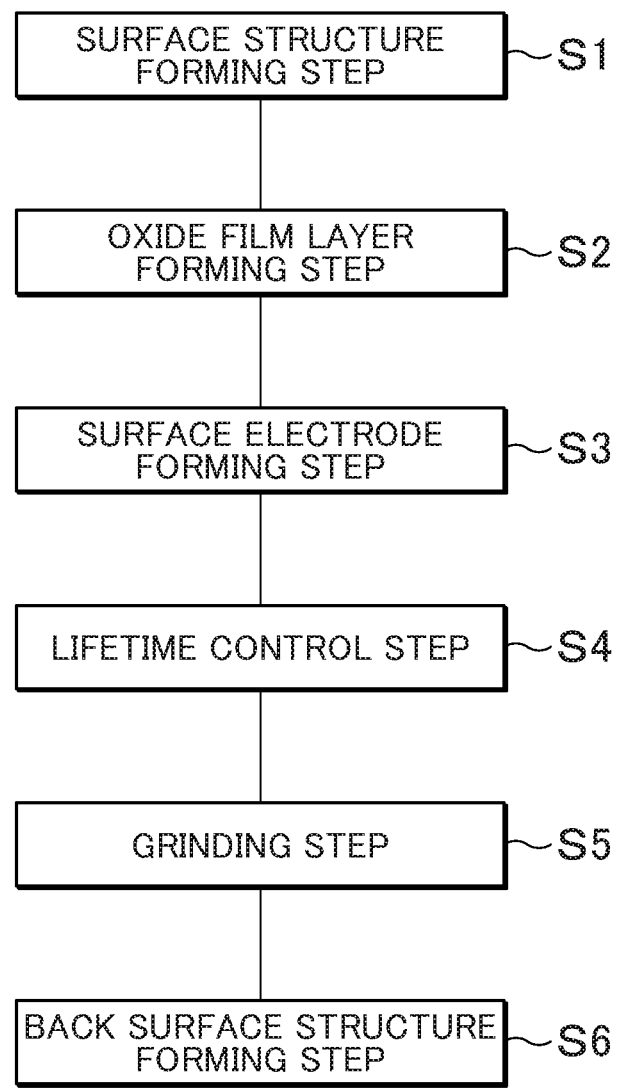
FIG. 2 is a flow diagram showing the manufacturing flow of the semiconductor device according to Embodiment 1.

FIG. 2 is a flow diagram showing the manufacturing flow of the semiconductor device of the present invention. A semiconductor substrate of n-type and with a high resistivity (FZ wafer, CZ wafer, MCZ wafer, etc.) is used for the semiconductor substrate of the first conductivity type. A thermal oxide film (a field oxide film, etc.) is formed on a mirror-finished front surface side of the semiconductor substrate. Also, the p-anode layer 3 and the p⁺-guard ring layers 11 as the front surface-side regions are respectively and selectively formed on the front surface side of the semiconductor substrate. Additionally, the interlayer insulating film 8 is formed on the front surface side of the semiconductor substrate. An opening portion of the interlayer insulating film 8 is selectively formed by selectively removing the interlayer insulating film 8. Thereby, the interlayer insulating film 8 is selectively formed. The semiconductor substrate which is an underlayer is exposed in the opening portion. The step thus far is a front surface-structure forming step (S1).

Subsequently, the front surface of the semiconductor substrate which is exposed in the opening portions of the selectively-formed interlayer insulating film 8 is exposed to the mixed solution of ammonium water ($[NH_4^+][OH^-]$ diluted aqueous solution, described as $NH_4OH$ below), hydrogen peroxide water ($H_2O_2$), and pure water ($H_2O$). Specifically, resin carriers with, for example, wafers arranged in units of several tens are immersed in the mixed solution. The duration of immersion may be several seconds to several minutes, for example, 60 seconds to 120 seconds. The temperature of the mixed solution is, for example, a room temperature (approximately 23° C.) to approximately 60° C. Also, a thin oxide film layer 4 can also be formed by exposing the wafers to the mixed liquid of hydrochloric acid (HCl), hydrogen peroxide water ($H_2O_2$), and water ($H_2O$).

In the process of immersion in this mixed solution, the oxide film layer 4 which is thinner than the natural oxide film is formed on an exposed surface which is the front surface side of the semiconductor substrate. The step of exposing the exposed surface to the mixed solution needs to be carried out before the natural oxide film is formed on the semiconductor substrate which is exposed in the opening portion. Thereby, the thickness of the oxide film layer 4 can be the thickness controlled to be thinner compared with the natural oxide film. In this manner, the step of forming the oxide film layer 4 on the front surface side of the semiconductor substrate exposed in the opening portion is viewed as an oxide-film-layer forming step (S2) below.

Even if the mixed solution described above is put on the surface of the thick oxide film such as PSG (Phosphosilicate Glass) or BPSG (Boron Phosphosilicate Glass), an oxide film is not formed because the speed of oxidation is slower than the speed of etching. Also, in the thick oxide film such as PSG or BPSG, $[OH^-]$ cannot reach the surface of the semiconductor substrate because the film thickness is large. Accordingly, an oxidation reaction of silicon and $OH^-$ does not occur either. Therefore, for the thick oxide film such as PSG or BPSG, the oxide film layer 4 is not formed by the oxide film forming step (S2).

Figure 3:
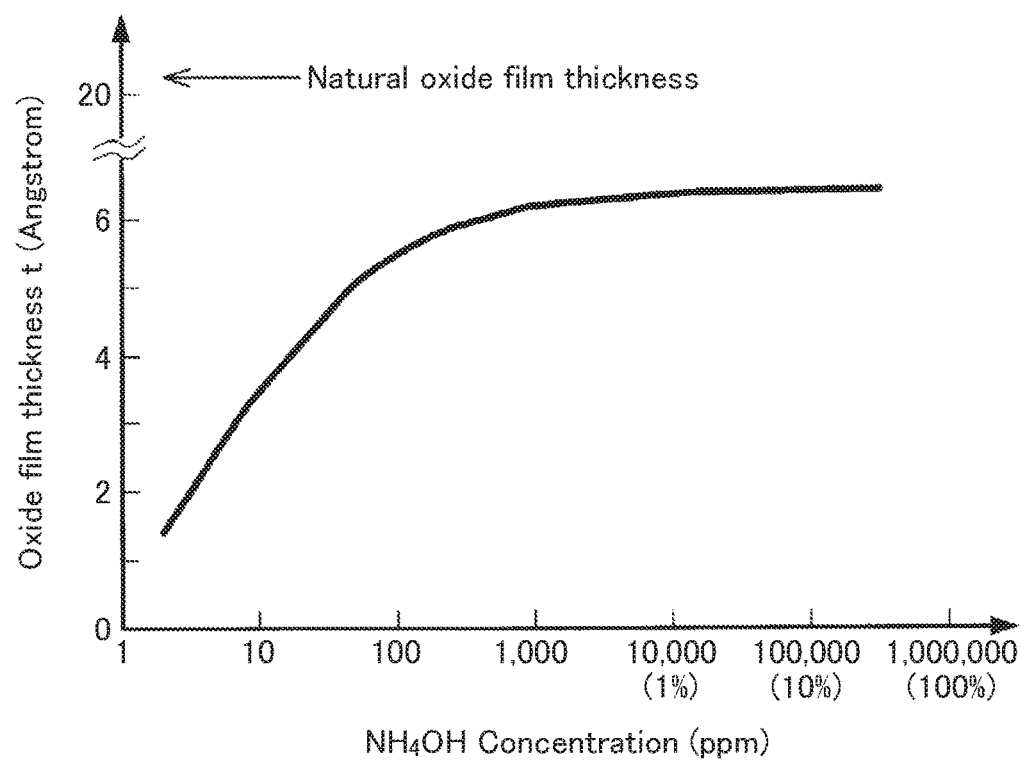
FIG. 3 is a feature diagram showing the relationship of the solution concentration and the oxide film thickness for the semiconductor device according to Embodiment 1.

The thickness of the oxide film layer 4 is adjusted according to the concentration of ammonium water ($NH_4OH$) in the mixed solution. FIG. 3 is a characteristic diagram showing a correlation of the concentration of ammonium water in the mixed solution (horizontal axis) and the thickness t of the oxide film layer 4 to be formed (vertical axis).

In the present example, the natural oxide film of the surface of the semiconductor substrate was removed at first by hydrofluoric acid. After that, the oxide film layer 4 was formed by immersing the semiconductor substrate in the mixed solution of a given concentration. The thickness of the oxide film layer 4 formed was measured by X-ray photoelectron spectroscopy (Electron Spectroscopy for Chemical Analysis, ESCA). In ESCA measuring equipment, PHI Quantera SXM™ of ULVAC-PHI, INC. was used.

The thickness of the oxide film layer 4 is 1 to 3 angstroms with the concentration of $NH_4OH$ in the order of 1 ppm, and the thickness of the oxide film layer 4 increases to approximately 6 angstroms if the concentration of $NH_4OH$ increases to 100 ppm. Also, at 1000 ppm, the thickness of the oxide film layer 4 to be formed saturates and becomes about 6 angstroms to 7 angstroms. In contrast, the thickness of the natural oxide film is typically 10 angstroms or more, for example, 20 angstroms. Thus, the oxide film layer 4 in the semiconductor device of the present invention is an oxide film layer in which the thickness is controlled to be thinner compared to the natural oxide film. Therefore, compared to the case of using the natural oxide film, the contact resistance of the anode electrode 5 and the p-anode layer 3 can be reduced.

In order to make the oxide film layer 4 to be of a predetermined thickness, it is preferred that the concentration of $NH_4OH$ is higher than or equal to 1 ppm and lower than or equal to 150000 ppm (15%), and more preferred that it is higher than or equal to 10000 ppm (1%) and lower than or equal to 50000 ppm (5%). Thereby, an oxide film layer 4 of about 6 angstroms can be stably formed. On the one hand, in order for the oxide film layer 4 to be thinner, it may be, for example, higher than or equal to 1 ppm and lower than or equal to 100 ppm.

Figure 4:
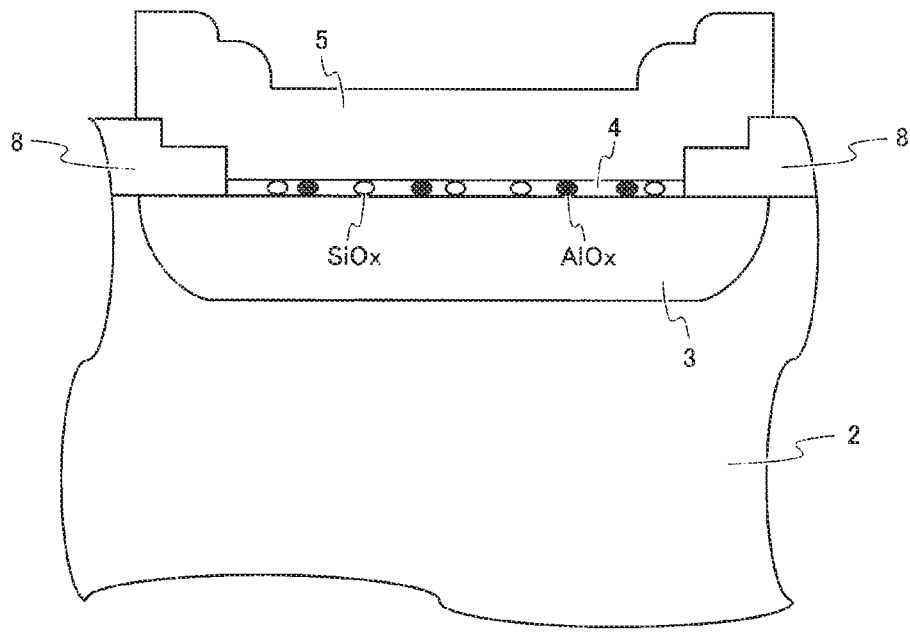
FIG. 4 is a figure showing an example in which the insulating-film layer 4 is a mixed film containing aluminum oxide and silicon oxide.

FIG. 4 is a figure showing an example in which the oxide film layer 4 is a mixed film containing aluminum oxide and silicon oxide. In FIG. 4, the vicinity of the oxide film layer 4 is magnified and is shown, with the other portions omitted. The thin oxide film layer 4 formed by the method above may be a mixed film containing not only $SiO_2$ but $AlO_x$ and $SiO_x$. $AlO_x$ in the mixed film is indicated by a colored circle and $SiO_x$ is indicated by a white circle. An oxygen concentration of this oxide film layer 4 can be assessed by Energy Dispersive X-ray Spectroscopy (EDX). By the EDX, it may be confirmed that the oxide film layer 4 is different from the natural oxide film.

In case of forming the oxide film layer 4 by the method above, oxidization and etching processes are repeated by the mixed solution on the surface of the silicon substrate as the semiconductor substrate. Thereby, the surface of the silicon substrate becomes slightly rough. In order to measure the damage of the surface of the silicon substrate, and to assess the roughness of the oxide film layer 4 formed, Scanning Tunneling Microscope (STM) was used.

The roughness of the oxide film layer 4 formed was 10-30% in film thickness. In contrast, the roughness of the natural oxide film is below 10%, typically in the order of 1%. In order words, the surface of the oxide film layer 4 formed by the method above becomes rougher than the surface of the natural oxide film. As the foregoing, the oxide film layer 4 is formed by repetition of oxidation and etching by the mixed solution. In contrast, it can be considered that the natural oxide film grows in the horizontal direction, which is the direction parallel to the surface of the silicon substrate, with the oxide film which has grown to be island shaped as a core. Therefore, it is considered that the surface of the oxide film layer 4 becomes rougher than the surface of the natural oxide film.

Also, as the mixed solution contains ammonium water ($NH_4OH$), the insulating-film layer 4 contains more Si—H bonds than the natural oxide film at the interface of the oxide film layer 4 and the silicon substrate. The natural oxide film is formed by the reaction with the air containing oxygen and nitrogen, so it is considered that the natural oxide film contains more nitrogen than the insulating-film layer 4. The insulating-film layer 4 may be regarded as not containing nitrogen. It may be put herein that not containing nitrogen is that the nitrogen content at the interface of the silicon substrate and the natural oxide film is less than $1\times10^{14}$ cm$^{-3}$. In order to assess the chemical bonding state of the interface, Infrared Reflection Absorption Spectrometry (IR-RAS) may be used.

In the above, the batch type treatment which immerses a plurality of wafers in a mixed solution is described. However, the single wafer processing in which wafers are put piece by piece in a mixed solution may be performed. In the single wafer processing, a piece of wafer is mounted on a stage such that the surface is the top face, for example, and the wafer is rotated with a given rotation velocity. By dropping the mixed solution on a wafer that is rotating and spreading the mixed solution over the entire wafer, the opening portion of the interlayer insulating film 8 is put in the mixed solution (spin coating). For the case of the single wafer processing, treating conditions such as the time per piece to put in the solution, temperature, etc. can be adjusted, and variations in the treating conditions among the wafers can be reduced to be small.

Subsequently, the anode electrode 5 is selectively formed by sputtering, etc. before a natural oxide film is formed in the oxide film layer 4. The metal of the anode electrode 5 is a metal alloy of aluminum (Al) and silicon (Si), for example. As needed, the metallic film to be an electrode is sintered at a temperature of about 380° C. to 450° C. Also, a protective film may be formed by polyimide, etc. The step above is a surface-electrode forming step (S3). Also, for the anode electrode 5, metal alloy of aluminum (Al), silicon (Si), and copper (Cu) other than the metals mentioned above may be used. In that case, the mass ratio of Si in the metal alloy may be 1 to 2%, and the mass ratio of Cu may be 0.1% or greater.

Subsequently, an electron beam is irradiated from the front surface side or the back surface side of the semiconductor substrate. Thereby, a lattice defect for lifetime control is introduced in the semiconductor substrate. After that, annealing treatment is performed as needed. This step is viewed as a lifetime control step (S4).

Subsequently, the back surface of the semiconductor substrate is ground and etched. Thereby, the semiconductor substrate is reduced down to the thickness of about 50 μm to 200 μm. This step of reducing the thickness of the semiconductor substrate is a grinding step (S5).

Subsequently, hydrogen, phosphorous, etc. is injected from the back surface of the ground semiconductor substrate. Thereby, the n-field stop layer 7 and the n$^+$ cathode layer 1 are formed. Next, a cathode electrode containing aluminum, (Al), titanium (Ti) or gold (Au), etc. is formed by sputtering, etc. These steps are viewed as a back-surface-structure forming step (S6). The semiconductor device of the present invention is formed by the steps above.

EXAMPLE

Figure 5:
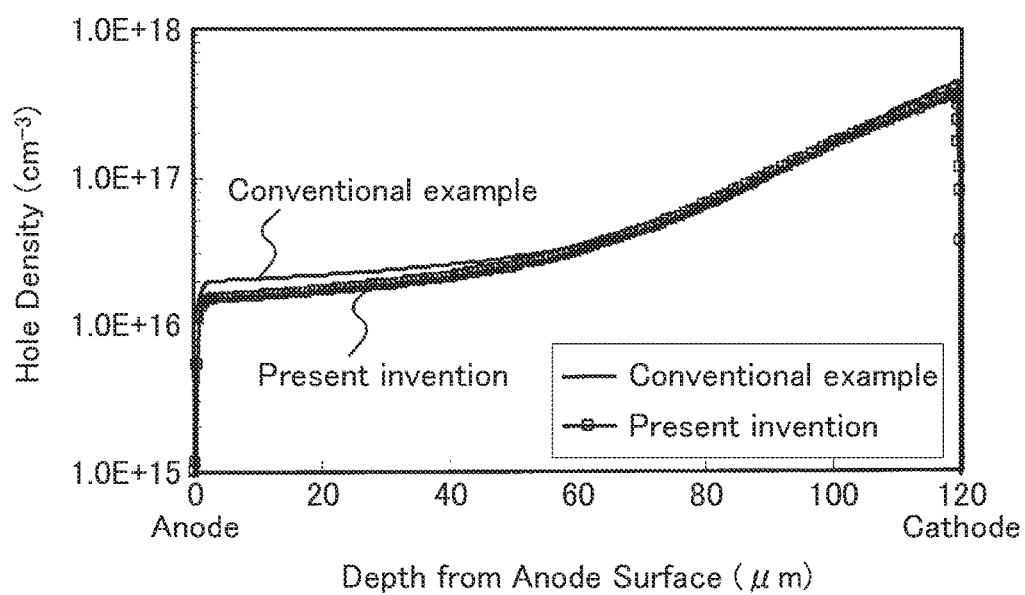
FIG. 5 is a feature diagram showing an inside condition when applying current for the semiconductor device according to Embodiment 1.

FIG. 5 is a feature diagram for the semiconductor device according to Embodiment 1 of the present invention showing the concentration distribution of holes and electrons at the time of applying current where a forward bias is applied in a diode. The horizontal axis indicates the depth from the surface of the anode, with the left end being the anode and the right end being the cathode. The vertical axis indicates the density of holes. It can be seen in the structure in which the oxide film layer 4 is deposited that the carrier density on the anode side is decreasing more than in the conventional structure. Thus, the injection of carriers is suppressed by the oxide film layer 4.

Figure 6:
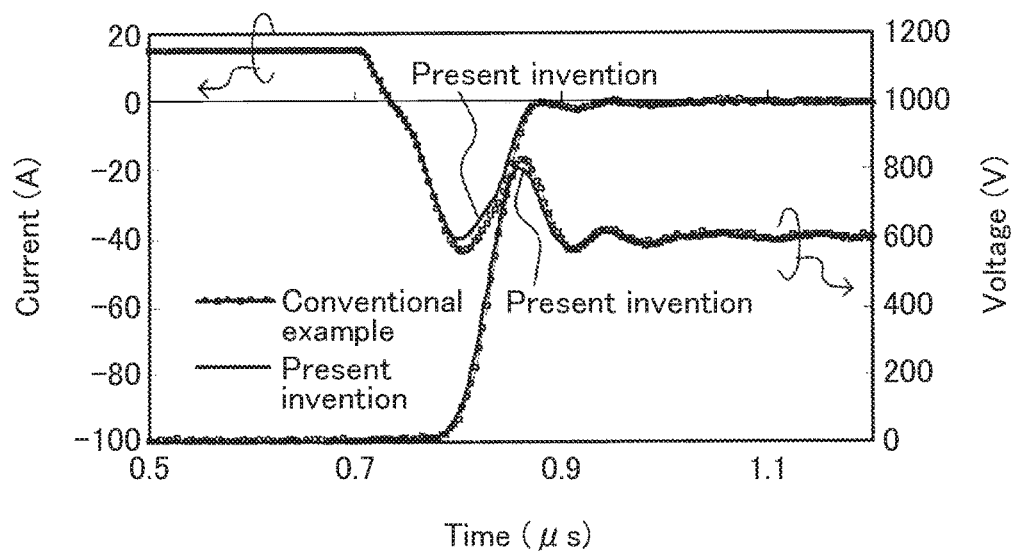
FIG. 6 is a feature diagram showing the current and voltage waveforms at the time of reverse recovery for the semiconductor device according to Embodiment 1.

FIG. 6 is a feature diagram for the semiconductor device according to Embodiment 1 of the invention in which the current and the voltage waveforms at the time of reverse recovery are compared to the conventional example. Compared to the conventional structure, the injection of holes is suppressed in the structure of the present invention, so it can be seen that the reverse recovery peak current (Irp) is decreasing.

Figure 7:
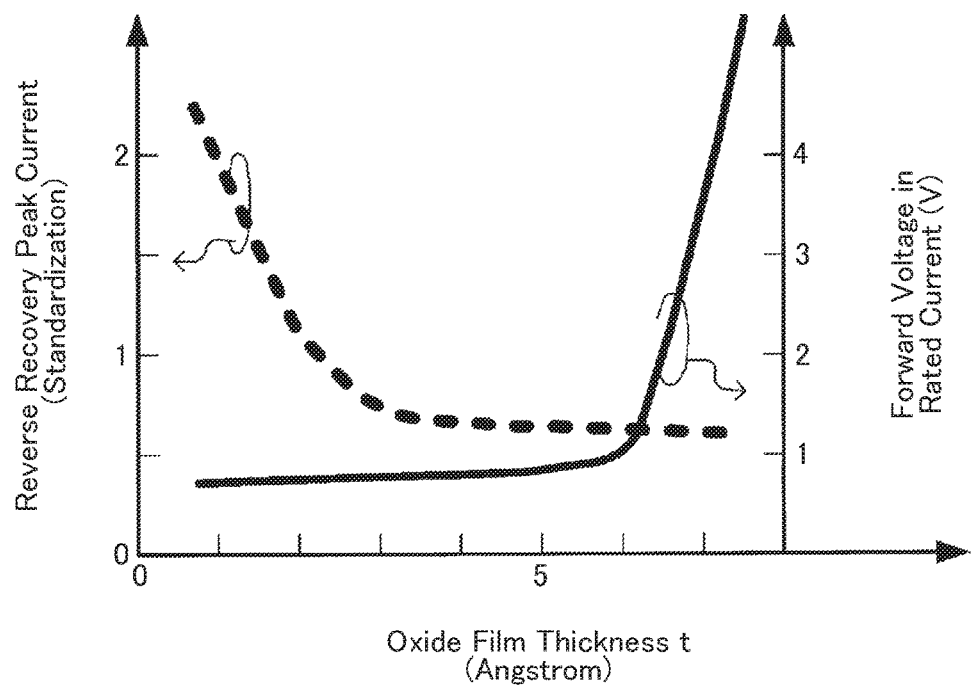
FIG. 7 is a feature diagram showing the relationship of the oxide-film thickness and the electrical feature for the semiconductor device according to Embodiment 1.

FIG. 7 is a feature diagram showing the relationship between the thickness and the electrical feature of the oxide film layer 4 for the semiconductor device according to Embodiment 1 of the present invention. Among the longitudinal axes, the left axis indicates the reverse recovery peak current (Irp). The longitudinal axis of the dashed-line graph is the left axis. The values on the left axis indicate the values of which the reverse recovery peak current is standardized with a rated current when a reverse recovery was carried out on a diode, the rated current being the current in the forward direction. The right axis indicates a forward-direction voltage drop (forward voltage, $V_F$) when passing the rated current. The longitudinal axis of the solid-line graph is the right axis. The horizontal axis indicates the thickness of the oxide film layer 4.

The reverse recovery peak current of the dashed-line graph decreases as the thickness of the oxide film layer 4 increases from 1 angstrom to 4 angstroms. In contrast, it saturates if the thickness of the oxide film layer 4 exceeds 4 angstroms. The forward voltage of the solid-line graph is almost flat when the thickness of the oxide film layer 4 is from 1 angstrom up to less than 6 angstroms. In contrast, the forward voltage sharply increases if the thickness of the oxide film layer 4 exceeds 6 angstroms. This means that the carriers (electrons or holes) cannot tunnel through the oxide film layer 4 if the thickness of the oxide film layer 4 exceeds 6 angstroms, and conductivity modulation stopped in the $n^-$-drift layer 2. Hence, the thickness of the oxide film layer 4 is preferably greater than or equal to 1 angstroms and less than or equal to 6 angstroms, more preferably, greater than or equal to 2 angstroms and less than or equal to 4 angstroms.

As the above, an oxide film layer 4 with the thickness that is controlled and thinner than the natural oxide film is formed between the anode electrode 5 and the p-anode layer 3. Thereby, it is possible to provide the semiconductor device and the manufacturing method thereof which allow the reduction in the reverse recovery peak current (Irp) by inhibiting the injection of holes from the anode layer and hardly changing the switching loss (Err).

Embodiment 2

Figure 8:
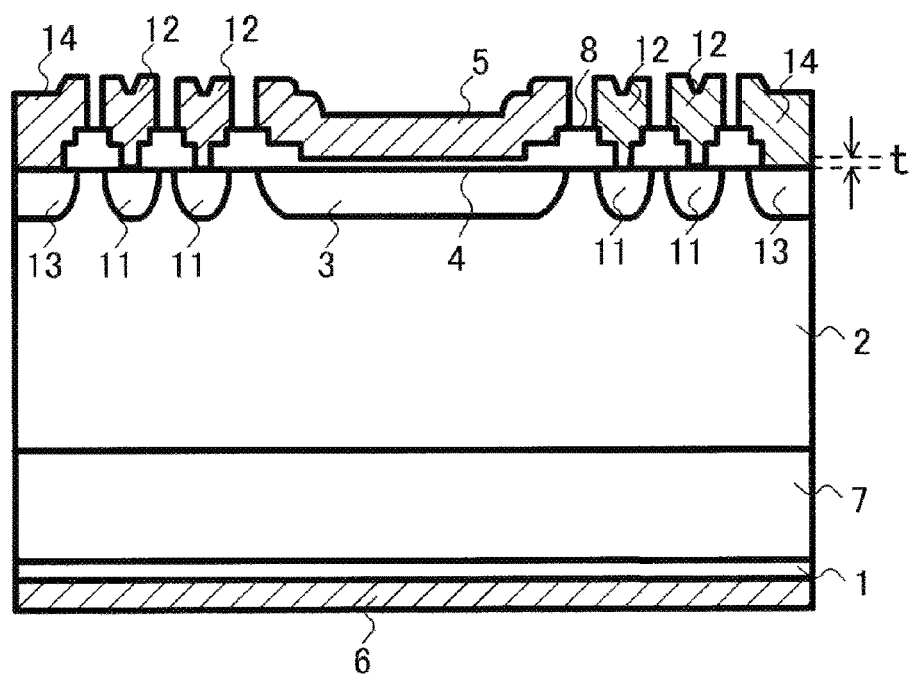
FIG. 8 is a cross-sectional view showing the layer structure of the semiconductor device according to Embodiment 2.

FIG. 8 is a cross-sectional view showing the layer structure of the semiconductor device according to Embodiment 2 of the present invention. A difference between the semiconductor device of Embodiment 2 and the semiconductor device of Embodiment 1 is that the field plate electrodes 12 of the edge termination region electrically connect with p+-guard ring layers 11 directly and in a circular manner without placing the oxide film layer 4 between them. By doing so, electric potential can be transferred more without delay in response to the application of voltage.

Embodiment 3

A thin oxide film layer 4 is not limited to only $SiO_2$. When forming the anode electrode 5 of an Al film, $AlO_x$ film is occasionally produced as oxygen originating in the $SiO_2$ film is taken into the Al film in a thermal treatment. In that case, there is an effect of suppressing the injection of carriers similarly for the $AlO_x$ film of 1 nm or less. Therefore, the oxide film layer 4 may contain the $AlO_x$ film with thickness of 1 nm or less. Furthermore, if $AlO_x$ and $SiO_2$ are mixed, the increase in contact resistance and the changes in Err hardly occur and the suppression effect of carrier injections can be obtained. Therefore, the oxide film layer 4 may contain a film with the thickness of 1 nm or less in which $AlO_x$ and $SiO_2$ are mixed.

Embodiment 4

Figure 9:
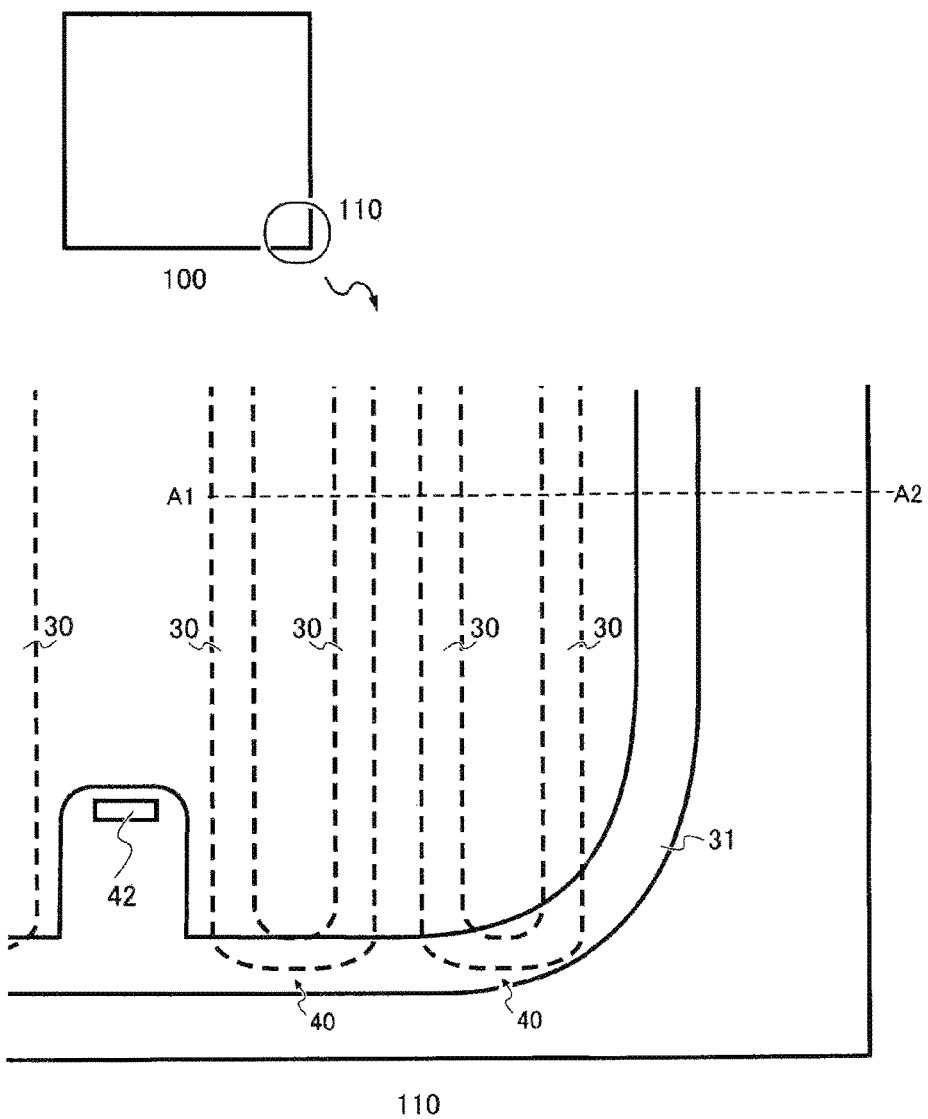
FIG. 9 is a schematic top view of the corner portion 110 of the semiconductor substrate 100 according to Embodiment 4.

FIG. 9 is a schematic top plan view of the corner portion 110 of the semiconductor device according to Embodiment 4. FIG. 9 is not a figure showing the outermost surface of the corner portion 110. FIG. 9 is a convenient view for describing a positional relationship between gate electrodes 30 and a lower wiring 31. In FIG. 9, the gate electrodes 30 are shown with a dashed line, and the lower wiring 31 is shown with a solid line.

The lower wiring 31 comprises a portion which extends in parallel to the end portion which is parallel to a first direction of the semiconductor substrate 100. Also, the lower wiring 31 comprises a portion which extends in parallel to the end portion which is parallel to a second direction of the semiconductor substrate 100. At the contact portion 42, the lower wiring 31 electrically connects with a contact metal which is provided closer to the front surface side than the lower wiring 31.

The gate electrodes 30 comprise portions which extend in parallel to the end portion which is parallel to the first direction of the semiconductor substrate 100. The gate electrodes 30 comprise U-shaped turnover portions 40 when the semiconductor substrate 100 is viewed from the top.

In the present example, a lower wiring 31 is provided closer to the front surface side than the gate electrodes 30. The lower wiring 31 electrically connects with the gate electrodes 30 in the U-shaped turnover portions 40 of the gate electrodes 30.

Figure 10:
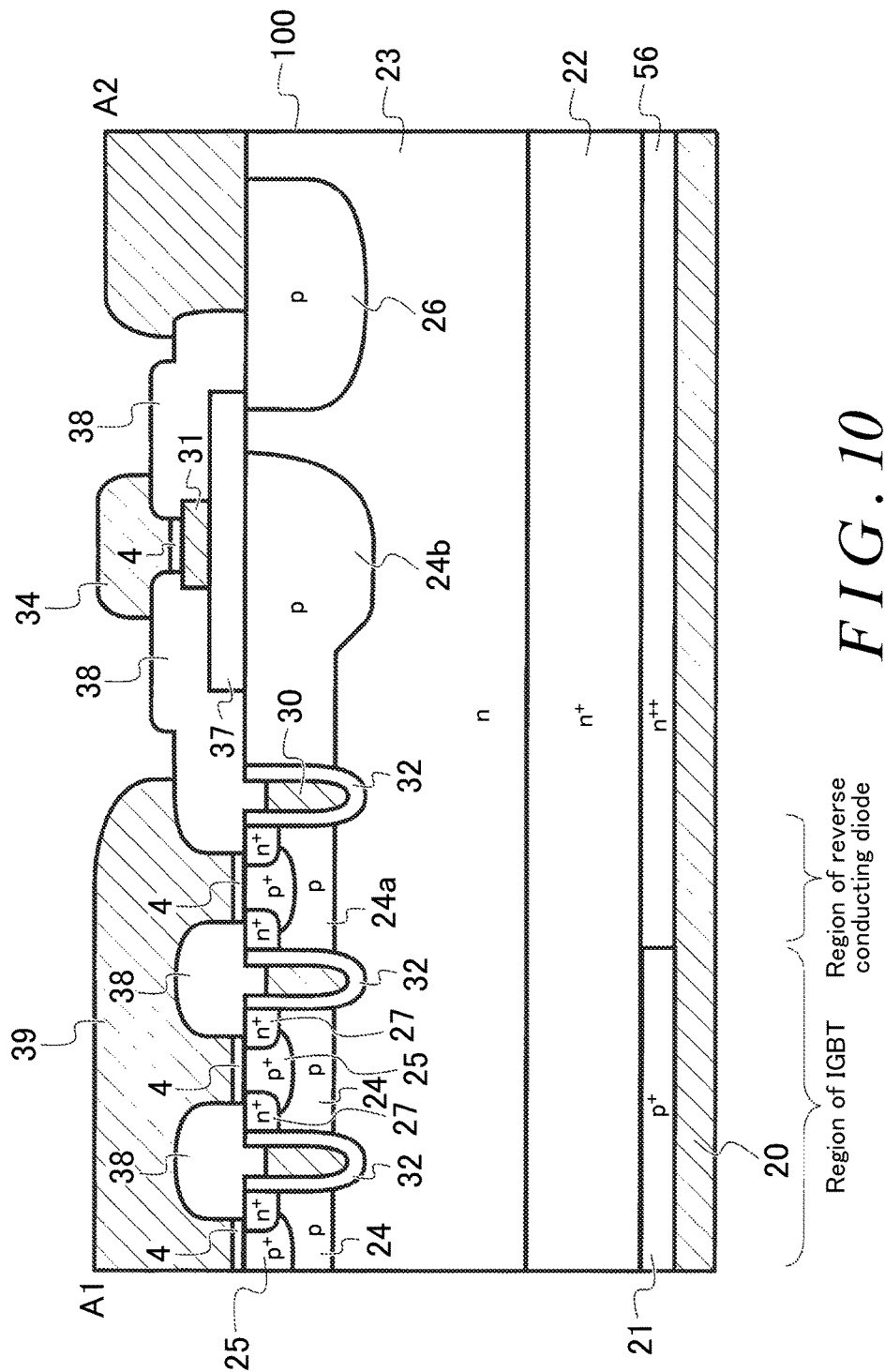
FIG. 10 is a figure showing A1-A2 cross section of FIG. 9.
Figure 11:
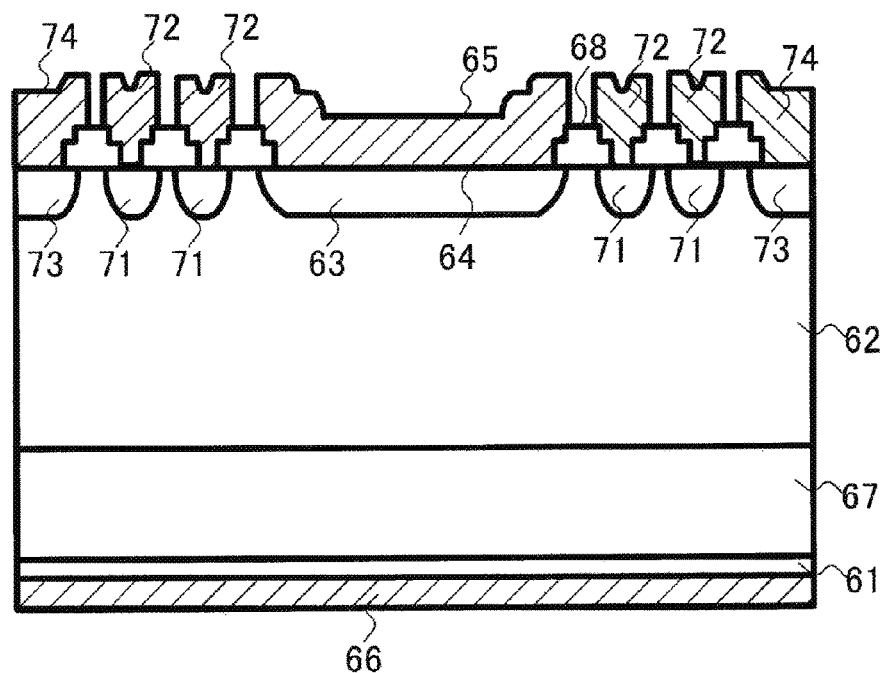
FIG. 11 is a cross-sectional view showing the layer structure of a conventional semiconductor device.

FIG. 10 is a figure showing the A1-A2 cross section of FIG. 9. The semiconductor device of the present example comprises a reverse conducting IGBT (RC-IGBT). The semiconductor substrate 100 comprises a collector electrode 20, a collector layer 21 of p+, a field stop layer 22, and a drift layer 23 in the order from the back surface side to the front surface side. Also, the semiconductor substrate 100 comprises p regions 24 and a guard ring layer 26 on the front surface side of a drift layer 23. The p region 24 comprises a p base region 24a which is shallower than the trench-shaped gate electrodes 30 and a p+-well region 24b which is deeper than the p-base region 24a. Also, a cathode layer 56 of $n^{++}$ is formed in a portion of the back surface of the semiconductor substrate 100. The region in which this cathode layer 56 of $n^{++}$ is formed becomes a reverse conducting diode in which the p-base region 24a on the front surface side functions as a p-type anode layer. A reverse recovery action of the reverse conducting diode becomes a soft recovery by the oxide film layer 4 being formed in this reverse conducting diode.

In the p regions 24, contact regions of a second conductivity type are provided as front-surface-side regions. In the present example, the contact regions of the second conductivity type are $p^+$ contacts 25. The $p^+$ contacts 25 are provided among the plurality of gate electrodes 30. The gate electrodes 30 are electrically separated from the p regions 24 by a gate insulating film 32. The gate electrodes 30 of the present example are trench-shaped gate electrodes. Also, the gate electrodes 30 of the present example comprise polysilicon. The gate insulating film 32 of the present example is an oxide film with the thickness of 1000 angstroms. An $n^+$ region 27 is provided between the gate-insulating film 32 and the $p^+$ contact 25. The lower wiring 31 is, for example, polysilicon. The gate electrodes 30, specifically formed by polysilicon, may be connected to the upper wiring 34 continuously at the U-shaped turnover portions 40 when the semiconductor substrate 100 is viewed from the top.

The semiconductor device of the present example is closer to the front surface side of the semiconductor substrate 100 than the gate electrode 30 and comprises an interlayer insulating film 38 in contact with the gate electrode 30. However, the semiconductor device of the present example is closer to the front surface side of the semiconductor substrate 100 than the $p^+$ contacts 25 and comprises the oxide film layer 4 in contact with the $p^+$ contacts 25. The oxide film layer 4 is an oxide film layer formed by the foregoing mixed solution. The oxide film layer 4 comprises a thickness which is sufficiently thinner than the interlayer insulating film 38. An emitter electrode 39 is provided on the front surface side of the oxide film layer 4 and the interlayer insulating film 38. The emitter electrode 39 of the present example is aluminum silicide (Al—Si). The front surface side of the oxide film layer 4 is the surface of the oxide film layer 4 on the opposite side from the surface on which the oxide film layer 4 and the $p^+$ contact 25 make contact.

The semiconductor device of the present example comprises a thermal oxide film 37 on the front surface side of the semiconductor substrate 100 in the p region 24 ($p^+$ well region 24b) in the vicinity of the guard ring layer 26. The portion in which the thermal oxide film 37 and the p region 24 make contact is called the back surface side of the thermal oxide film 37. The surface on the opposite side from the back surface side of the thermal oxide film 37 is called the front surface side of the thermal oxide film 37.

The semiconductor device of the present example comprises the lower wiring 31 as the electrode of the polysilicon film connecting electrically with a plurality of gate electrodes 30 in the front surface side of the thermal oxide film 37. The lower wiring 31 is formed in the upper side of the $p^+$ well region 24b with the thermal oxide film 37 placed in between. The interlayer insulating film 38 is provided in the front surface side of the lower wiring 31. The semiconductor device of the present example comprises the oxide film layer 4 in the opening portion of the interlayer insulating film 38. This oxide film layer 4 is also an oxide film layer formed by the foregoing mixed solution.

The portion in which the oxide film layer 4 and the lower wiring 31 make contact is called the back surface side of the oxide film layer 4. The surface on the opposite side of the back surface side of the oxide film layer 4 is called the front surface side of the oxide film layer 4. The semiconductor device of the present example comprises an upper wiring 34 as an outer metal electrode on the front surface side of the oxide film layer 4. The upper wiring 34 is the outer electrode provided at least in a portion of the vicinity of the outer circumference of the semiconductor device. The upper wiring 34 is, for example, Al—Si. In this manner, the oxide film layer 4 is also provided between the upper wiring 34 and the lower wiring 31.

Although it has been described with a focus on silicon as the semiconductor substrate, it is not to limited to silicon, and it can also be applicable to a wide bandgap semiconductor such as silicon carbide (SiC), gallium nitride (GaN), etc. In other words, the purpose of the present application can be accomplished if there is an insulating film in which the thickness is controlled to be thinner than a natural oxide film as described above, in particular, a silicon oxide film between the metal which is to be the electrode and the semiconductor substrate.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each step performed by an apparatus, system, program, and method shown in the claims, embodiments, or diagrams can be performed in any order as long as the order is not indicated by "prior to," "before," or the like and as long as the output from a previous step is not used in a later step. Even if the step flow is described using phrases such as "first" or "next" in the claims, embodiments, or diagrams, it does not necessarily mean that the step must be performed in this order.

EXPLANATION OF REFERENCES

1 . . . $n^+$ cathode layer, 2 . . . $n^-$-drift layer, 3 . . . p-anode layer, 4 . . . oxide film layer, 5 . . . anode electrode, 6 . . . cathode electrode, 7 . . . n-field stop layer, 8 . . . interlayer insulating film, 11 . . . $p^+$-guard ring layer, 12 . . . field plate electrode, 13 . . . channel stopper layer, 14 . . . stopper electrode, 20 . . . collector electrode, 21 . . . collector layer, 22 . . . field stop layer, 23 . . . drift layer, 24 . . . p region, 24a . . . p-base region, 24b . . . $p^+$-well region, 25 . . . $p^+$ contact, 26 . . . guard ring layer, 27 . . . $n^+$ region, 30 . . . gate electrode, 31 . . . lower wiring, 32 . . . gate-insulating film, 34 . . . upper wiring, 37 . . . thermal oxide film, 38 . . . interlayer insulating film, 39 . . . emitter electrode, 40 . . . U-shaped turnover portion, 42 . . . contact portion, 56 . . . cathode layer, 61 . . . $n^+$-cathode layer, 62 . . . $n^-$-drift layer, 63 . . . p-anode layer, 64 . . . surface, 65 . . . anode electrode, 66 . . . cathode electrode, 67 . . . n-field stop layer, 68 . . . interlayer insulating film, 71 . . . $p^+$-guard ring, 72 . . . field plate electrode, 73 . . . channel stopper layer, 74 . . . stopper electrode, 100 . . . semiconductor substrate, 110 . . . corner portion.

What is claimed is:

1. A semiconductor device comprising:
   a drift layer of a first conductivity type provided on a semiconductor substrate of a first conductivity type;
   a front-surface-side region of a second conductivity type provided on a front surface side of the drift layer;
   an insulating-film layer provided in direct contact with a front surface side of the front-surface-side region and entirely covering the front-surface-side region, having a minimum thickness thinner than a natural oxide film; and a metal layer provided in direct contact with a front surface side of the insulating-film layer,
wherein the front-surface-side region is directly below the metal layer.

2. The semiconductor device according to claim 1, further comprising a plurality of guard ring layers of a second conductivity type formed selectively on the front surface side of the drift layer so as to surround the front-surface-side region and formed by spacing apart from the front-surface-side region, wherein
the insulating-film layer is provided on front surface sides of the plurality of guard ring layers.

3. The semiconductor device according to claim 1, wherein the front-surface-side region is an anode layer.

4. The semiconductor device according to claim 1, wherein the front-surface-side region is a contact region of a second conductivity type between a plurality of gate electrodes.

5. The semiconductor device according to claim 4, further comprising the insulating-film layer between an outer electrode provided at least in a portion of the vicinity of an outer circumference of the semiconductor device and a metal electrode electrically connecting to the plurality of gate electrodes.

6. The semiconductor device according to claim 1, wherein the thickness of the insulating-film layer is more than or equal to 1 angstrom and less than or equal to 6 angstroms.

7. The semiconductor device according to claim 1, wherein the insulating-film layer contains more Si—H bonds than in a natural oxide film at an interface of the semiconductor substrate and the insulating-film layer.

8. The semiconductor device according to claim 1, wherein the insulating-film layer does not contain nitrogen.

9. The semiconductor device according to claim 1, wherein the insulating-film layer is a mixed film containing aluminum oxide and silicon oxide.

10. The semiconductor device according to claim 1, wherein a roughness of the insulating-film layer is 10% to 30% of a film thickness of the insulating-film layer.

11. The semiconductor device according to claim 1, wherein the metal layer is an alloy comprising aluminum.

12. The semiconductor device according to claim 1, further comprising:
a cathode layer of the first conductivity type provided on a back surface side of the semiconductor substrate; and
a field stop layer of the first conductivity type provided between the cathode layer and the drift layer.

* * * * *